US009111797B2

(12) United States Patent
Choi et al.

(10) Patent No.: US 9,111,797 B2
(45) Date of Patent: Aug. 18, 2015

(54) 3-D NONVOLATILE MEMORY DEVICE AND METHOD OF MANUFACTURING THE SAME

(75) Inventors: Eun Seok Choi, Seongnam-si (KR); Hyun Seung Yoo, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/613,839

(22) Filed: Sep. 13, 2012

(65) Prior Publication Data

US 2013/0099306 A1 Apr. 25, 2013

(30) Foreign Application Priority Data

Oct. 25, 2011 (KR) ........................ 10-2011-0109487

(51) Int. Cl.

| | |
|---|---|
| ***H01L 29/78*** | (2006.01) |
| ***H01L 27/115*** | (2006.01) |
| ***H01L 29/66*** | (2006.01) |
| ***H01L 29/792*** | (2006.01) |

(52) U.S. Cl.

CPC ...... *H01L 27/11524* (2013.01); *H01L 27/1157* (2013.01); *H01L 27/11556* (2013.01); *H01L 27/11578* (2013.01); *H01L 27/11582* (2013.01); *H01L 29/66833* (2013.01); *H01L 29/792* (2013.01)

(58) Field of Classification Search

CPC ............ H01L 27/105; H01L 27/11573; H01L 27/11582; H01L 29/78; H01L 21/336; H01L 21/4763; H01L 29/792; H01L 21/11578

USPC ............. 257/68, 71, 202, 277, 296–314, 516, 257/532, 535, E21.662–E21.665, E21.679, 257/E27.104, E29.131, E27.016–E27.045, 257/E27.071, E27.087–E27.095, E29.218

See application file for complete search history.

(56) References Cited

U.S. PATENT DOCUMENTS

| | | | | |
|---|---|---|---|---|
| 8,188,517 | B2 | 5/2012 | Choi | |
| 2004/0155284 | A1 * | 8/2004 | Kim | 257/324 |
| 2007/0290200 | A1 * | 12/2007 | Asano | 257/40 |
| 2008/0067583 | A1 * | 3/2008 | Kidoh et al. | 257/326 |
| 2011/0169072 | A1 * | 7/2011 | Lim et al. | 257/329 |

FOREIGN PATENT DOCUMENTS

| | | |
|---|---|---|
| KR | 10-1028993 | 4/2011 |
| KR | 10-1073074 | 10/2011 |

* cited by examiner

*Primary Examiner* — Fernando L Toledo
*Assistant Examiner* — Lawrence-Linh T Nguyen
(74) *Attorney, Agent, or Firm* — William Park & Associates Patent Ltd.

(57) ABSTRACT

A three-dimensional (3-D) nonvolatile memory device includes a support protruded from a surface of a substrate and configured to have an inclined sidewall; channel structures each configured to comprise interlayer insulating layers and channel layers which are alternately stacked over the substrate including the support, bent along the inclined sidewall of the support, wherein each of the channel structures comprises a cell region and a contact region, and the channel layers are exposed in the contact region; select lines formed over the channel structures; and a pillar type channels coupled to respective channel layers at the contact region and penetrating the select lines.

13 Claims, 10 Drawing Sheets

SL
37
38
36
BL
35B
35A
35
34
32
33
C
W
ø
31
30
WL_N-1 WL_N
WL_N WL_N-1
Cell region
Contact region
Cell region

3-D NONVOLATILE MEMORY DEVICE AND METHOD OF MANUFACTURING THE SAME

CROSS-REFERENCE TO RELATED APPLICATION

The present application claims priority under 35 U.S.C. 119(a) to Korean patent application number 10-2011-0109487 filed on Oct. 25, 2011 in the Korean Intellectual Property Office, which is incorporated herein by reference in its entirety as set forth in full.

BACKGROUND

1. Field of the Invention

Embodiments of this disclosure relate to a semiconductor device and a method of manufacturing the same and, more particularly, to a three-dimensional (3-D) nonvolatile memory device and a method of manufacturing the same.

2. Description of the Related Art

A nonvolatile memory device retains data stored therein even though the supply of power is cut off. As the degree of integration of 2-D memory devices in which memory cells are formed in a single layer over a silicon substrate reaches a limit, there is proposed a 3-D nonvolatile memory device in which memory cells are vertically stacked in multiple layers from a silicon substrate.

The structure of a known 3-D nonvolatile memory device is described below.

FIG. 1 is a perspective view showing the structure of a known 3-D nonvolatile memory device.

As shown in FIG. 1, the known 3-D nonvolatile memory device includes a plurality of channel structures C extended in parallel in a first direction I-I', a plurality of vertical gates 14 each placed between the channel structures C adjacent to each other and vertically protruded from a substrate 10, and a plurality of word lines WL coupled to the plurality of vertical gates 14 and extended in parallel in a second direction II-II'.

Each of the channel structures C includes a plurality of interlayer insulating layers 11 and a plurality of channel layers 12 which are stacked in an alternating manner over the substrate 10. Furthermore, a tunnel insulating layer 13A, a charge trap layer 13B, and a charge blocking layer 13C are interposed between the vertical gate 14 and the channel structure C.

In this structure, a plurality of strings is arranged in parallel to the substrate 10 and is stacked over the substrate 10. Accordingly, the degree of integration of memory cells can be improved as compared with a 2-D memory device.

BRIEF SUMMARY

An example embodiment of this disclosure relates to a 3-D nonvolatile memory device and a method of manufacturing the same, which can reduce an area of a contact region.

In an aspect of this disclosure, a 3-D nonvolatile memory device includes a support protruded from a surface of a substrate and configured to have an inclined sidewall; channel structures each configured to comprise interlayer insulating layers and channel layers which are alternately stacked over the substrate including the support, bent along the inclined sidewall of the support, wherein each of the channel structures comprises a cell region and a contact region, and the channel layers are exposed in the contact region; select lines formed over the channel structures, and a pillar type channels coupled to respective channel layers at the contact region and penetrating the select lines.

In another aspect of this disclosure, a method of manufacturing a 3-D nonvolatile memory device includes forming a support protruded from a surface of a substrate and configured to have an inclined sidewall; forming channel structures each configured to comprise first interlayer insulating layers and channel layers which are alternately stacked over the substrate including the support, bent along the etched face of the support, wherein each of the channel structures comprises a cell region and a contact region, and the channel layers are exposed in the contact region; and forming select lines coupled to the respective channel layers at the contact region.

DESCRIPTION OF EMBODIMENTS

Hereinafter, some example embodiments of the present disclosure will be described in detail with reference to the accompanying drawings. The figures are provided to allow those having ordinary skill in the art an understanding of a scope of the embodiments of the disclosure.

Figure 2A:
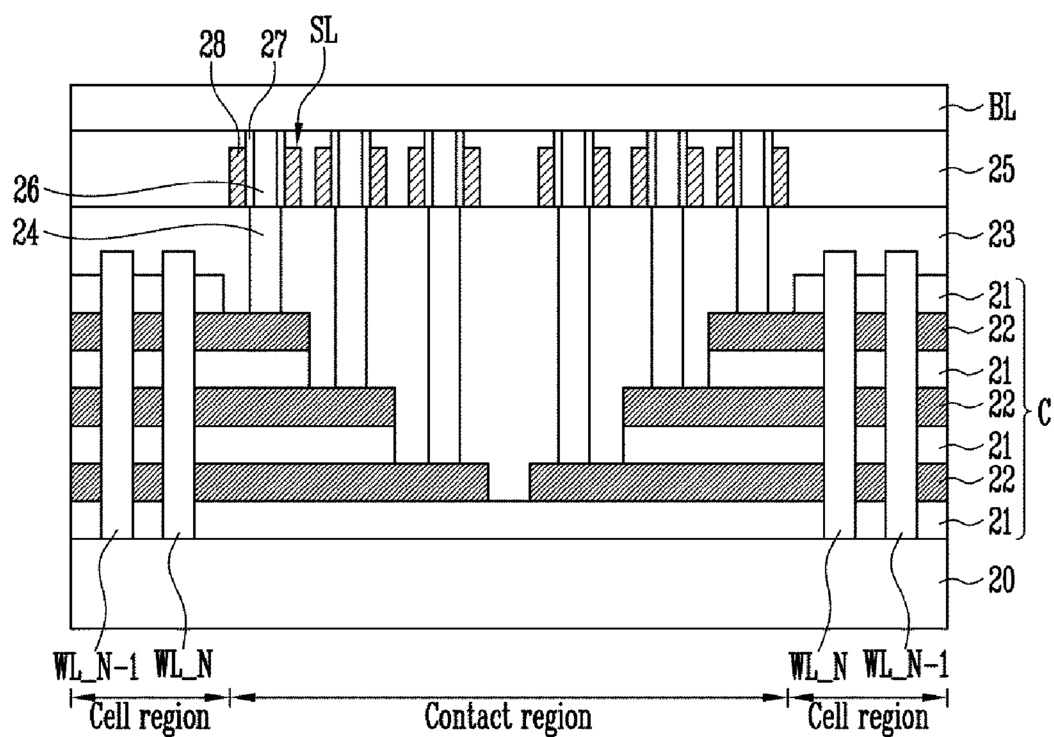
FIG. 2A is a cross-sectional view showing a structure of a 3-D nonvolatile memory device according to a first embodiment of this disclosure.

FIG. 2A is a cross-sectional view showing a structure of a 3-D nonvolatile memory device according to a first embodiment of this disclosure.

Figure 1:
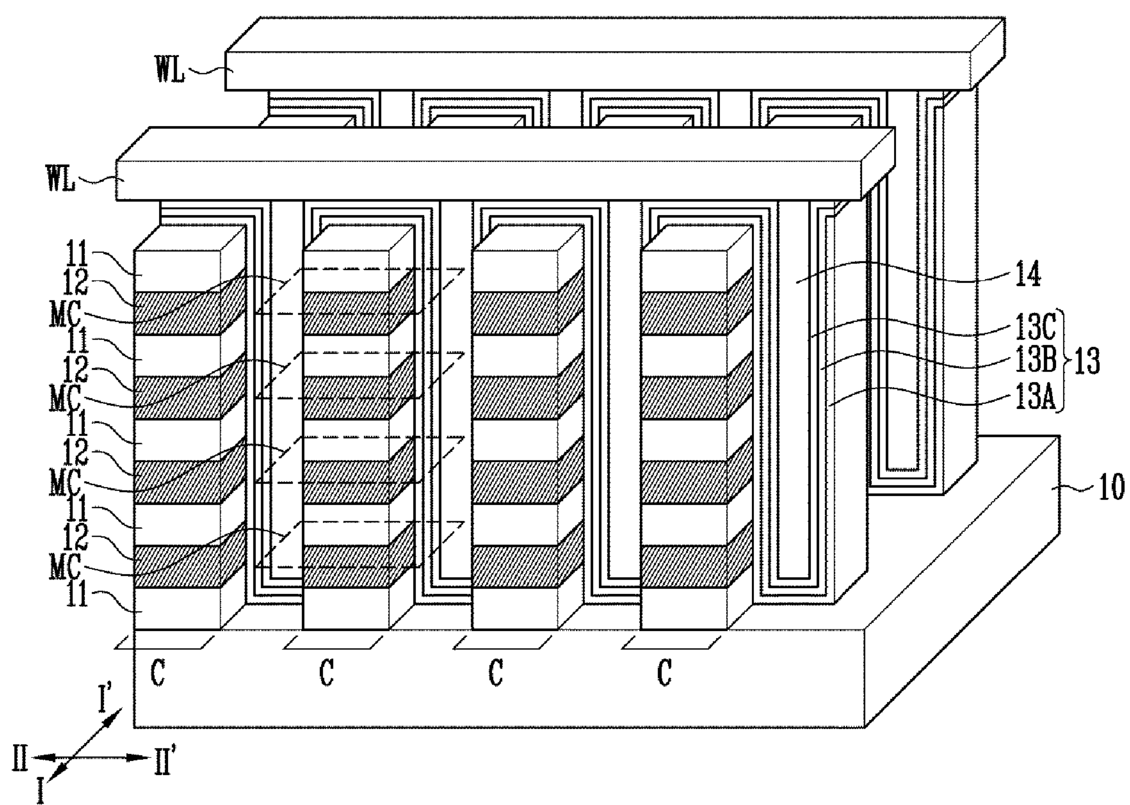
FIG. 1 is a perspective view showing a structure of a known 3-D nonvolatile memory device.

As shown in FIG. 2A, the memory device according to the first embodiment of this disclosure includes a plurality of channel structures C extended in the first direction (refer to I-I' of FIG. 1) and a plurality of word lines WL configured to cross the channel structures C and extended in parallel in the second direction (refer to II-II' of FIG. 1).

Each of the channel structures C includes a plurality of channel layers 22 and a plurality of interlayer insulating layers 21 stacked in an alternating manner. The channel structure C further includes cell regions in which a plurality of memory cells is formed and a contact region through which the plurality of channel layers 22 is exposed.

The contact region is patterned stepwise, and thus the plurality of channel layers 22 is exposed through the contact region. Accordingly, the channel layers 22 exposed in the contact region form respective contact pads. A plurality of contact plugs 24 is coupled to the respective contact pads of layers, that is, the respective channel layers 22 and is configured to penetrate a first insulating layer 23. Furthermore, a plurality of select lines SL is coupled to the plurality of contact plugs 24.

The plurality of select lines SL is extended in parallel in a direction to cross the channel structures C. A select transistor is provided in each region where the select lines SL cross the contact plugs 24. Each of the select transistors includes a pillar type channel 26, a gate electrode 28 configured to surround the pillar type channel 26, and a gate insulating layer 27 interposed between the pillar type channel 26 and the gate electrode 28. The pillar type channel 26 is coupled to the contact plug 24.

Furthermore, a bit line BL is formed on a second insulating layer 25 including the select lines SL and is extended in the same direction as the channel structure C. Here, the bit line BL is coupled to the pillar type channels 26 of the plurality of select transistors.

In accordance with the first embodiment, an area of the contact region can be reduced by coupling the contact pads and the select lines through the respective contact plugs.

Figure 2B:
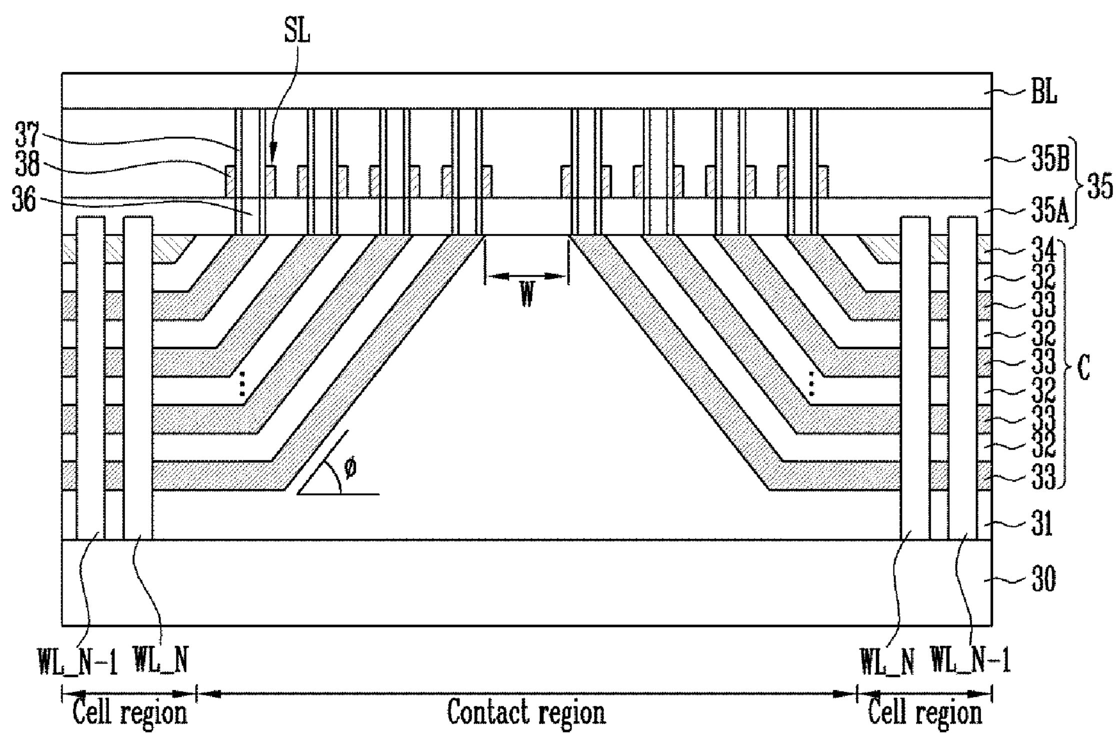
FIG. 2B is a cross-sectional view showing a structure of a 3-D nonvolatile memory device according to a second embodiment of this disclosure.

FIG. 2B is a cross-sectional view showing the structure of a 3-D nonvolatile memory device according to a second embodiment of this disclosure.

As shown in FIG. 2B, the memory device according to the second embodiment of this disclosure includes supports 31, channel structures C formed over the respective supports 31, a plurality of select lines SL coupled to respective channel layers 33 via the pillar type channel 36.

The support 31 includes an etched face which is protruded from a surface of a substrate 30 and is inclined. The etched face has a slant of a specific angle ϕ to the surface of the substrate 30, and the angle ϕ of the incline plane may be 5 to 85°.

The support 31 may be a projecting part that forms a trapezoid or a triangle. If the projecting part of the support 31 forms a trapezoid, a width between the channel structures C adjacent to each other is determined by the width W of the flat top surface of the projecting part. Accordingly, the degree of integration of memory devices can be improved by reducing the width W of the top surface of the projecting part. It is preferred that the width W of the top surface be 1 μm or less.

The support 31 may be integrally formed with the substrate 30 or may be formed of an insulating layer. A method of forming the support 31 is described in detail later with reference to FIGS. 4 and 5.

The channel structure C includes a plurality of interlayer insulating layers 32 and a plurality of channel layers 33 which are alternately stacked over the substrate 30. The channel structure C is formed on the substrate 30 including the support 31, and an end of the channel structure C is formed along the etched face of the support 31. Thus, a region of the channel structure C, formed along the etched face, is bent along the slant of the etched face.

In this structure, the channel structure C includes first regions formed flat on the substrate 30 and a second region formed with a slant along the etched face of the support 31. The first regions may be used as cell regions where a plurality of memory cells is formed. The second region may be used as a contact region where the plurality of channel layers 33 and the plurality of select lines SL come in contact with each other. A plurality of word lines WL is arranged in the cell regions, and the plurality of channel layers 33 is exposed in the contact region. The channel layers 33 exposed in the contact region are used as respective contact pads.

The channel structure C has a generally flat top surface, and there is no step between the cell region and the contact region. That is, the cell region and the contact region may be formed to have the same top surface without a step, and thus the channel structure C may comprise a top surface having the contact region and the cell region having a substantially same height. An etch-stop layer 34 used to stop polishing in a chemical mechanical polishing (CMP) process may partially remain in the cell region of the channel structure C.

The plurality of select lines SL is extended in parallel in a direction to cross the channel structure C. The plurality of select lines SL is arranged at a substantially same height and may be coupled to the respective contact pads, that is, the respective channel layers 33.

A select transistor is formed in each of the regions where the select lines SL cross respective channel layers 33. Each of the select transistors includes a pillar type channel 36, a gate electrode 38 configured to surround the pillar type channel 36, and a gate insulating layer 37 interposed between the pillar type channel 36 and the gate electrode 38. In particular, the pillar type channels 36 are formed to penetrate insulating layers 35 comprised of a first interlayer insulating layer 35A and a second interlayer insulating layer 35B and are directly coupled to the respective contact pads, that is, the channel layers 33 without additional contact plugs.

The memory device further includes the plurality of bit lines BL extended in the same direction as the channel structure C and coupled to the pillar type channels 36 of the plurality of select transistors.

In accordance with the second embodiment, the contact region and the cell regions of the channel structure C can be formed without a step. Accordingly, a difference between the lengths of stacked strings can be reduced including the stepwise patterned contact region, thereby making uniform cell characteristics. Furthermore, the degree of integration of memory devices can be further improved because an area of the contact region can be reduced.

Figure 2C:
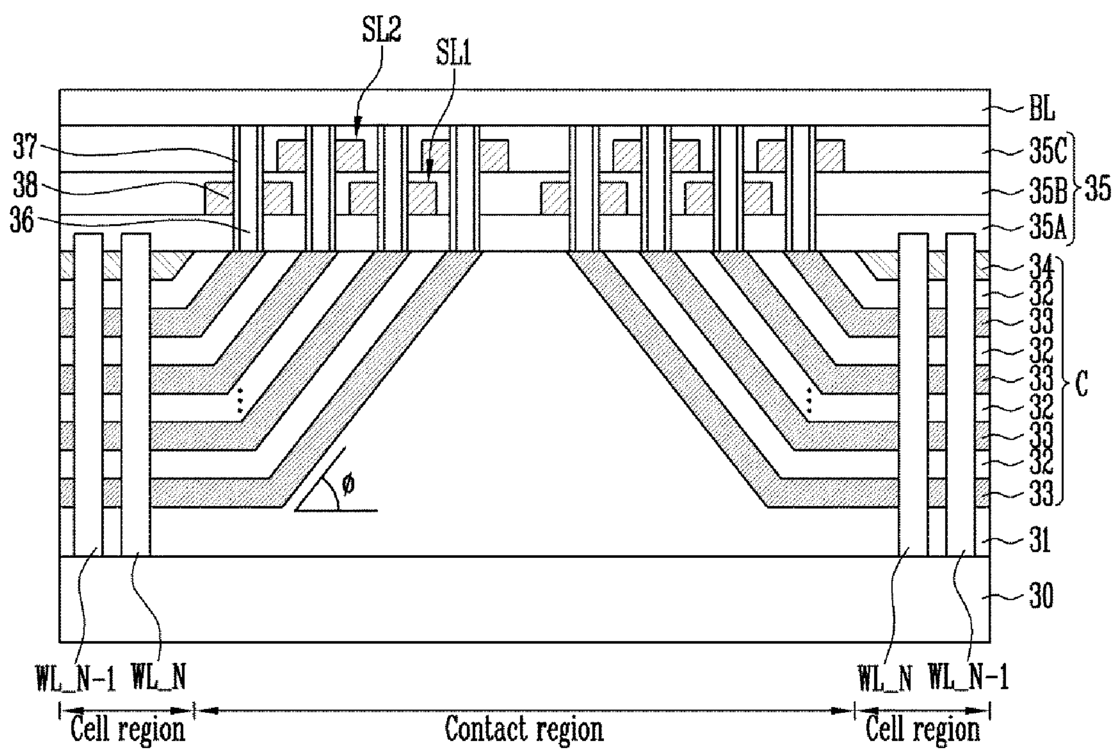
FIG. 2C is a cross-sectional view showing a structure of a 3-D nonvolatile memory device according to a third embodiment of this disclosure.

FIG. 2C is a cross-sectional view showing the structure of a 3-D nonvolatile memory device according to a third embodiment of this disclosure.

As shown in FIG. 2C, the memory device according to the third embodiment of this disclosure includes select lines SL1 and SL2 coupled to a plurality of channel layers 33, wherein the select lines SL1 and SL2 are placed at different levels and arranged in a staggered manner. That is, the plurality of select lines SL1 and SL2 are placed at several levels. For example, the first select lines SL1 may be formed at a lower level, and the second select lines SL2 may be formed at an upper level. In some embodiments, the select lines SL1 and SL2 may be arranged in two or more levels.

The remaining structures are the same as those of the second embodiment, and thus a description thereof is omitted.

In accordance with the third embodiment, the plurality of select lines SL1 and SL2 are placed at different levels and arranged in a staggered manner. Accordingly, an area of the contact region can be further reduced as compared with other structures in which the select lines SL are arranged in the same level.

Figure 2D:
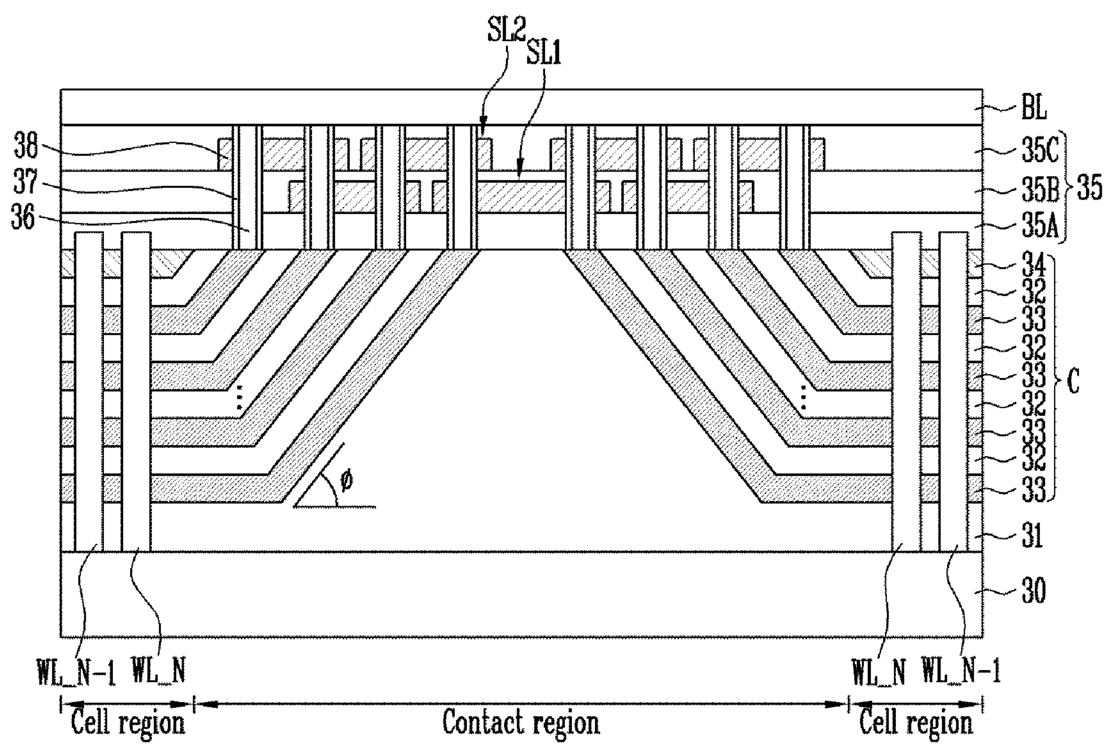
FIG. 2D is a cross-sectional view showing a structure of a 3-D nonvolatile memory device according to a fourth embodiment of this disclosure.

FIG. 2D is a cross-sectional view showing the structure of a 3-D nonvolatile memory device according to a fourth embodiment of this disclosure.

As shown in FIG. 2D, the memory device according to the fourth embodiment of this disclosure includes a plurality of select lines SL1 and SL2 placed at different levels and arranged in a staggered manner, wherein each of the select lines SL1 and SL2 is coupled to at least two adjacent channel layers 33. Some of the select lines SL1 and SL2 adjacent to each other in a stack direction are coupled in common to some of the channel layers 33. That is, the plurality of select lines SL1 and SL2 is placed at several levels. Each of the select lines SL1 and SL2 is coupled to at least two adjacent channel layers 33. Furthermore, the first select line SL1 disposed at a lower level and the second select line SL2 disposed at an upper level are arranged in a staggered manner and partially overlapped with each other so that they are coupled in common to some of the channel layers 33.

The remaining structures are the same as those of the second embodiment, and thus a description thereof is omitted.

In accordance with the fourth embodiment, a desired channel layer 33, that is, a desired string can be selected by combining the first select line SL1 and the second select line SL2.

FIGS. 3A to 3D are cross-sectional views illustrating a method of manufacturing a memory device according to an example embodiment of this disclosure. A method of manufacturing the memory device according to the second embodiment described with reference to FIG. 2B is described below.

Figure 3A:
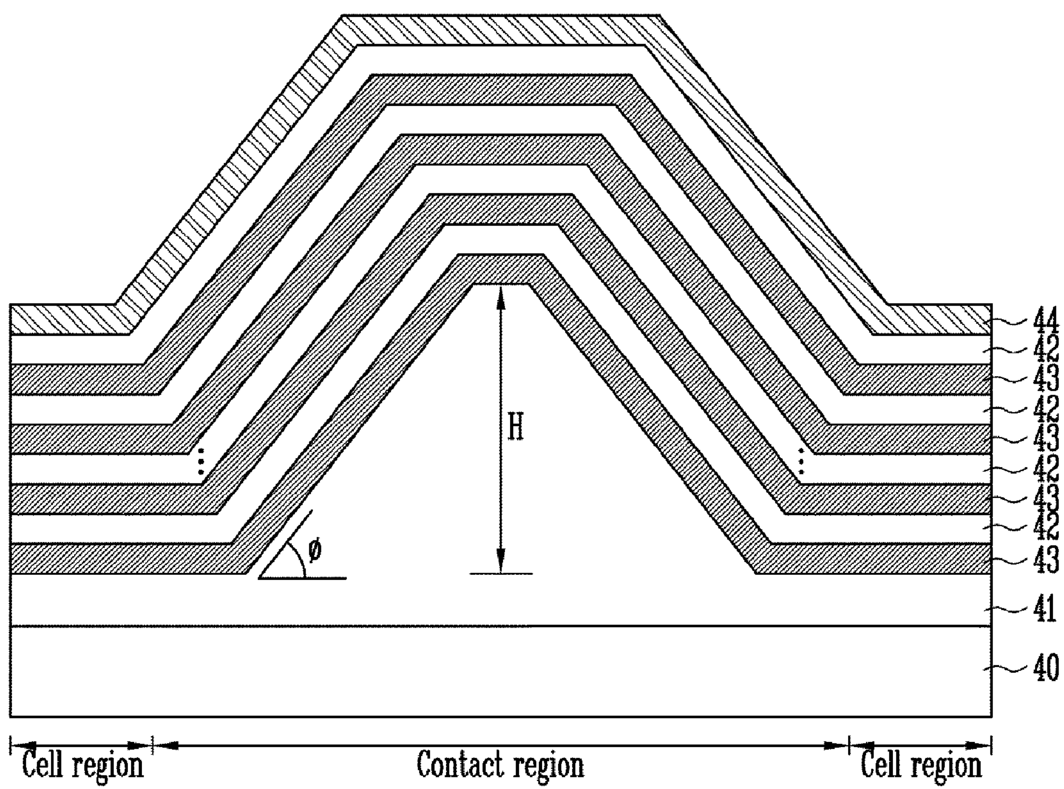
FIGS. 3A to 3D are cross-sectional views illustrating a method of manufacturing a memory device according to an example embodiment of this disclosure.

As shown in FIG. 3A, a support 41 having etched faces that are inclined and protrude from a surface of a substrate 40 is formed. The end of the channel structure C is bent upwardly along the support 41, and a contact region is formed at ends of the channel structure C. The support 41 is formed flat on a surface of the substrate 40 in cell regions where memory cells will be formed. The support 41 includes a projecting part having an incline plane of a specific angle ϕ in the contact region where contact pads will be formed. [look for contact region throughout]

A height H of the projecting part of the support 31 may be greater than a total sum of the thicknesses of a plurality of interlayer insulating layers 42 and a plurality of channel layers 43 which are formed in a subsequent process. In particular, the height H of the projecting part of the support 31 may be greater than the total sum of the thicknesses the plurality of interlayer insulating layers 42, the plurality of channel layers 43, and an etch stop layer 44.

The plurality of interlayer insulating layers 42 and the plurality of channel layers 43 are alternately formed, i.e., formed in an alternating manner, over the substrate 40 on which the support 41 is formed. Here, if the support 41 is formed by etching the substrate 40, the interlayer insulating layers 42 may be first formed. If the support 41 is formed by etching an insulating layer, the interlayer insulating layers 42 or the channel layers 43 may be first formed.

As a result, a stack body including the plurality of interlayer insulating layers 42 and the plurality of channel layers 43 is formed.

The plurality of interlayer insulating layers 42 and the plurality of channel layers 43 are formed along a profile of the support 41 so that a step according to the support 41 is incorporated. Furthermore, the interlayer insulating layers 42 may be formed of oxide layer, such as $SiO_2$, and the channel layers 43 may be formed of semiconductor layers, such as polysilicon layers.

Next, the etch stop layer 44 is formed on top of the highest interlayer insulating layer 42 or channel layer 43 depending on which forms the top layer of the channel structure C. The etch stop layer 44 is used for an etch stop in a subsequent etch process. The etch stop layer 44 may be formed of a combination of SiN and $SiO_2$.

Figure 3B:
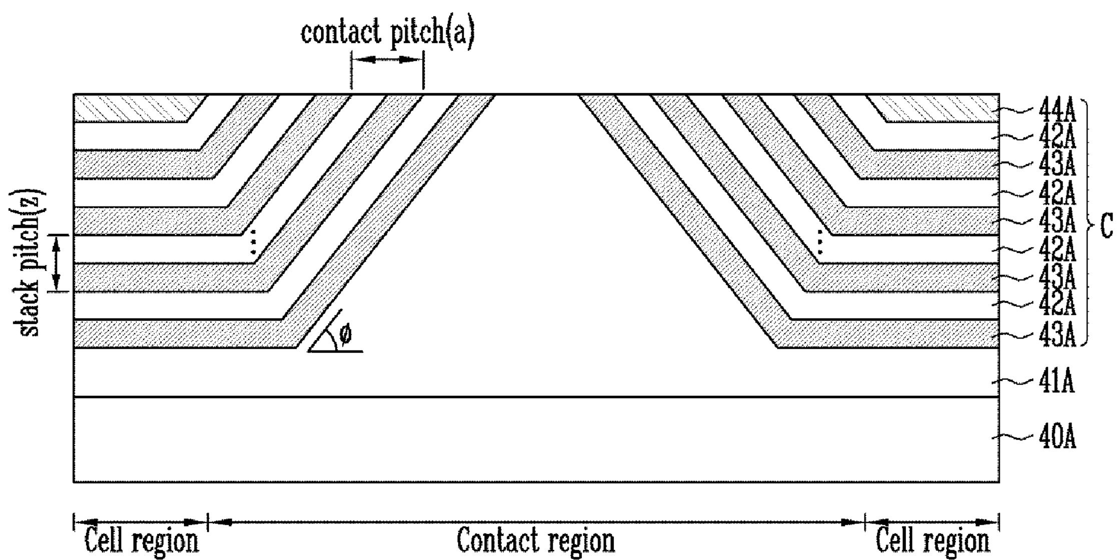

As shown in FIG. 3B, channel structures C are formed by performing a planarizing process on the interlayer insulating layers 42A and the channel layers 43A until a surface of the support 41 is exposed. For example, the etch stop layer 44A formed in the contact region is removed. chemical mechanical polishing (CMP) process using the etch stop layers 44A, remaining in the cell regions, as a polishing stop layer. As a result, the plurality of interlayer insulating layers 42A and the plurality of channel layers 43A which are stacked in the projecting part of the support 41A are etched, thereby defining the contact region in which the plurality of channel layers 43A is exposed.

In some embodiments, after forming a polishing oxide layer on the etch stop layer 44A, the etch stop layer 44A formed in the contact region may be removed by an etch-back process. In some embodiments, in the process of performing the CMP process, part of the top of the projecting part of the support 41A may be etched.

In FIG. 3B, the etched support is indicated by '41A', the etched interlayer insulating layers are indicated by '42A', and the etched channel layers are indicated by '43A'.

The channel layers 43A that are exposed in the contact region become respective contact pads, and the contact pads are coupled to the respective pillar type channels of select transistors which are formed in a subsequent process. An area of the contact pad may be determined by the angle ϕ of the incline plane of the support 41A and the thickness of the interlayer insulating layer 42A and the channel layer 43A. For example, given that the sum of the thicknesses of the interlayer insulating layer 42A of one layer and the channel layer 43A of one layer may be 'z' and the angle of the incline plane of the support 41A may be 'ϕ'. Here, a width necessary to form one contact pad, that is, a contact pitch a, is expressed by Equation 1 below, and the contact pitch 'a' is greater than the sum 'z'.

$$a = \frac{Z}{\sin\Phi}(a > z) \quad \text{[Equation 1]}$$

Referring to Equation 1, when the angle ϕ of the incline plane of the support 41 is 45°, an interval between the channel layers 43 that are exposed in the contact region is about 1.4 times the sum 'z'. That is, a contact pad having a sufficient area can be formed in a narrow area by forming the contact region using the inclined support.

Next, although not shown, a plurality of channel structures C extended in parallel in one direction is formed by patterning the stack body in which the plurality of contact pads is formed. In some embodiments, the channel structures C may be formed by patterning the stack body before forming the contact region.

Next, a process of forming a plurality of memory cells is performed. For example, a tunnel insulating layer, a charge trap layer, and a charge blocking layer may be formed on the entire surface where the plurality of channel structures C is formed. A vertical gate disposed between the channel structures C adjacent to each other and a plurality of word lines WL extended in a direction to cross the channel structures C may be formed.

Figure 3C:
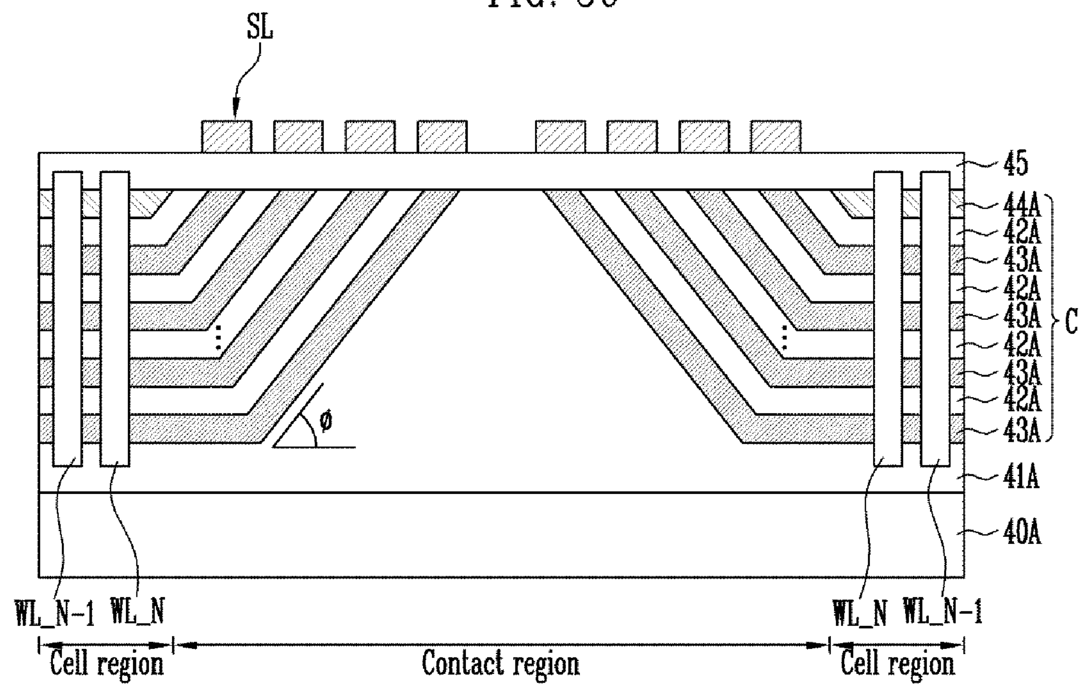

As shown in FIG. 3C, a first interlayer insulating layer 45 is formed on the resulting structure in which the plurality of contact pads is formed. A plurality of select lines SL is formed on the first interlayer insulating layer 45. The plurality of select lines SL is spaced apart from one another and may be formed at respective positions over a position where the contact pads are formed.

Figure 3D:
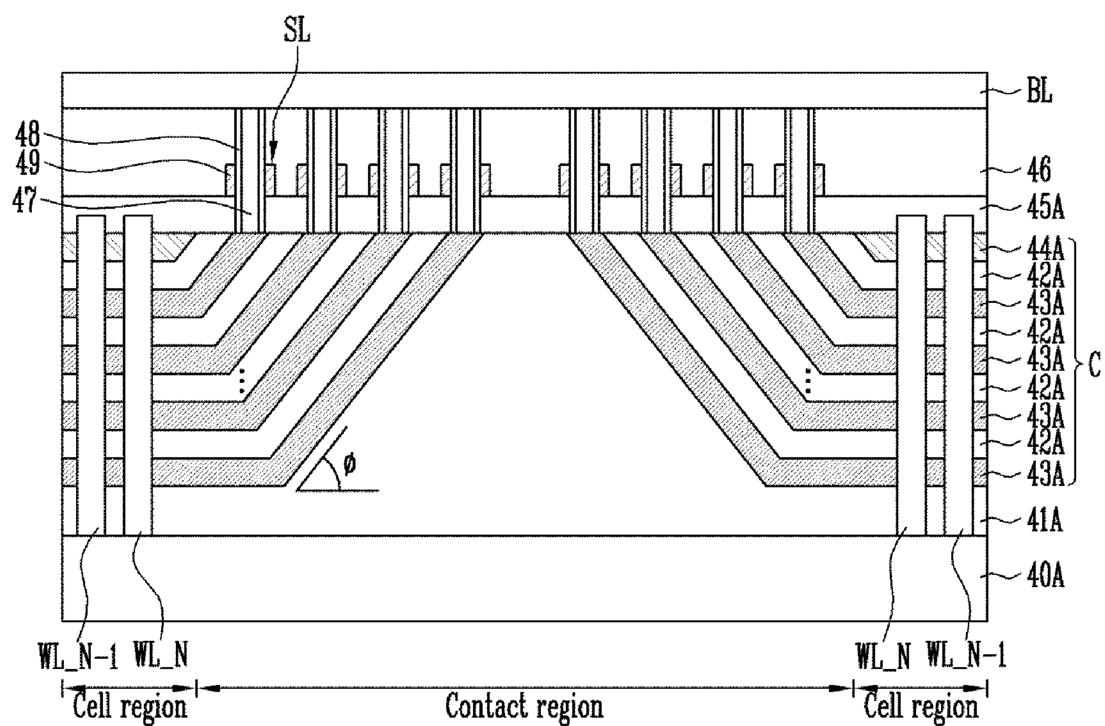

As shown in FIG. 3D, a second interlayer insulating layer 46 is formed on the first interlayer insulating layer 45A on which the plurality of select lines SL is formed. A plurality of contact holes through which the respective contact pads are exposed is formed by etching the second interlayer insulating layer 46, the select lines SL, and the first interlayer insulating layer 45A. In FIG. 3D, the first interlayer insulating layer etched in the process of forming the contact holes is indicated by '45A'.

A gate insulating layer 48 is formed on the inner wall of each of the contact holes. A pillar type channel layer 47 is formed within the contact hole on which the gate insulating layer 48 is formed. As a result, the select transistor, including the pillar type channel layer 47, a gate electrode 49 configured to surround the pillar type channel layer 47, and the gate insulating layer 48 disposed between the pillar type channel layer 47 and the gate electrode 49, is formed. The select transistor has a gate all-around structure in which the pillar type channel layer 47 is surrounded by the gate electrode 49 for 360° such that the gate electrode 49 substantially forms a ring around the pillar type channel layer 47 with the gate insulating layer 48 disposed between the gate electrode 49 and the pillar type channel layer 47.

An example in which the pillar type channel layer 47 and the gate insulating layer 48 penetrate the first interlayer insulating layer 45, the select lines SL, and the second interlayer insulating layer 46 is illustrated in FIG. 3D. In some embodiments, the gate insulating layer 48 may be selected only in a location where the pillar type channel layer 47 and the gate electrode 49 come in contact with each other. To this end, an interlayer insulating layer under the select lines SL, an interlayer insulating layer in which the select lines are filled, and an interlayer insulating layer over the select lines are formed.

Next, bit lines BL extended in the same direction as the channel structures C and coupled to the pillar type channel layers 47 of the select transistors are formed on the result structure in which the plurality of select transistors is formed. The bit lines BL may be formed by forming a conductive layer and patterning the conductive layer or using a damascene method.

The method of forming the memory device according to the second embodiment has been described above. The memory devices according to the third and the fourth embodiments may also be manufactured using a substantially same method as described above.

A method of forming the select lines SL1 and SL2 of the memory device according to the third embodiment is described below.

As shown in FIG. 2C, after forming the channel structure C including the plurality of contact pads, a first interlayer insulating layer 35A. The first select lines SL1 are formed on the first interlayer insulating layer 35A. The first select lines SL1 are formed at the positions of some of the plurality of contact pads.

A second interlayer insulating layer 35B is formed on the first interlayer insulating layer 35A on which the first select lines SL1 are formed. The second select lines SL2 are formed on the second interlayer insulating layer 35B. The second select lines SL2 are formed at the positions of the remaining contact pads of the plurality of contact pads. Accordingly, the first select lines SL1 and the second select lines SL2 are formed at different heights from each other and may be arranged at different positions of the plurality of contact pads.

A third interlayer insulating layer 35C is formed on the second interlayer insulating layer 35B on which the second select lines SL2 are formed. First contact holes through which some of the plurality of contact pads is exposed are formed by etching the third interlayer insulating layer 35C, the second interlayer insulating layer 35B, the first select lines SL1, and the first interlayer insulating layer 35A. At the same time, second contact holes through which the remaining contact pads of the plurality of contact pads are exposed are formed by etching the third interlayer insulating layer 35C, the second select line SL2, the second interlayer insulating layer 35B, and the first interlayer insulating layer 35A.

After forming a gate insulating layer 37 on the inner walls of the first contact holes and the second contact holes, a plurality of pillar type channel layers 36 is formed.

A method of forming the select line SL1 and SL2 of the memory device according to the fourth embodiment is described below.

As shown in FIG. 2D, after forming the channel structure C including the plurality of contact pads, a first interlayer insulating layer 35A is formed. The first select lines SL1 are formed on the first interlayer insulating layer 35A. Each of the first select lines SL1 are formed to cover at least two adjacent channel layers at a position where the at least two adjacent channel layers are formed.

A second interlayer insulating layer 35B is formed on the first interlayer insulating layer 35A on which the first select lines SL1 are formed. The second select lines SL2 are formed on the second interlayer insulating layer 35B. Each of the second select lines SL2 are formed to cover at least two adjacent channel layers at a position where the at least two adjacent channel layers are formed, and staggered with the first select line SL1. In particular, the first select line SL1 and the second select line SL2 adjacent to each other in the stack direction overlap with each other so that they cover some of the channel layers.

A third interlayer insulating layer 35C is formed on the second interlayer insulating layer 35B on which the second select lines SL2 are formed. A plurality of contact holes through which the plurality of contact pads is exposed is formed by etching the third interlayer insulating layer 35C, the second select lines SL2, the second interlayer insulating layer 35B, the first select lines SL1, and the first interlayer insulating layer 35A.

After forming a gate insulating layer 37 on the inner walls of the plurality of contact holes, a plurality of pillar type channel layers 36 is formed.

Figure 4:
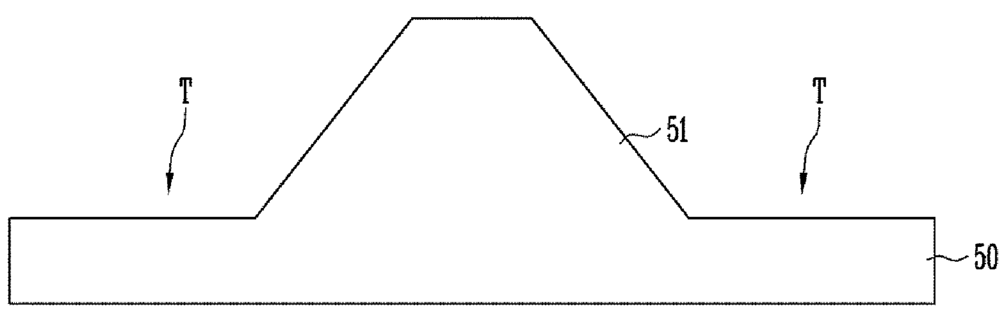
FIGS. 4 and 5 are cross-sectional views illustrating a method of forming a support according to an example embodiment of this disclosure.
Figure 5:
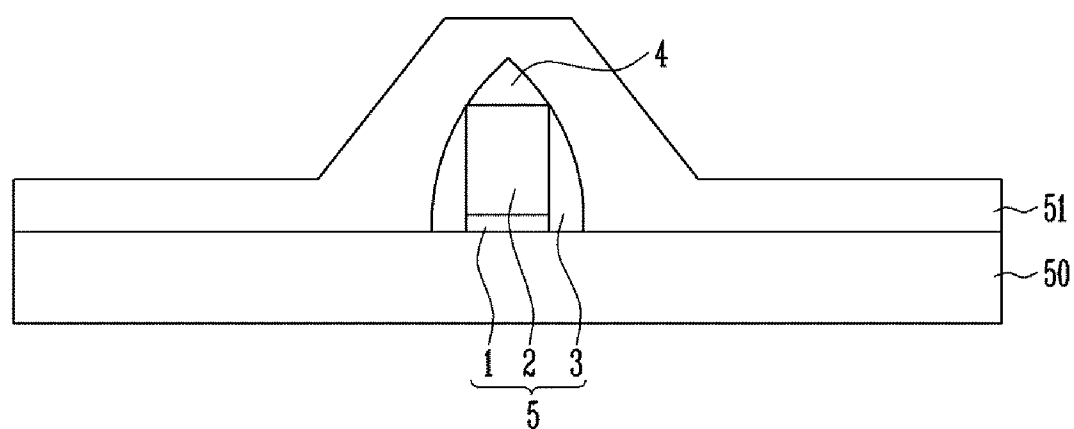

FIGS. 4 and 5 are cross-sectional views illustrating a method of forming the support according to an example embodiment of this disclosure.

As shown in FIG. 4, a support 51 may be formed by etching a substrate 50. For example, a trench T may be formed in a region where a memory block will be formed by etching the substrate 50. A projecting part for separating the trenches T is used as the support 51 according to an example embodiment of this disclosure. Accordingly, the support 51 is integrally formed with the substrate 50.

In order for the support 51 to be inclined and have an etched face, a process condition is controlled in the process of etching the trenches T. For example, the support 51 being inclined and having an etched face may be formed by etching the substrate 50 using a combination of isotropic etching and isotropic etching.

If the support 51 is formed by etching the substrate 50 as described above, it is preferred that the interlayer insulating layer be first formed and the channel layers then be formed when forming the stack body in order to electrically isolate the channel structure C and the substrate 50 from each other.

In some embodiments, after forming an insulating layer on the substrate, the support may be formed by etching the insulating layer. In this case, when forming the stack body, the channel layers may be formed and the interlayer insulating layer may be then formed.

As shown in FIG. 5, a dummy structure 5 is formed on the substrate 50. An insulating layer may be formed on the entire surface of the substrate 50 on which the dummy structure 5 is formed, thereby forming the support 51.

The dummy structure 5 is used to form the projecting part of the support 51 which is protruded from a surface of the substrate 50. The dummy structure 5 may be formed by an additional process or by using part of a process of manufacturing the memory device.

For example, the dummy structure 5 may be a dummy transistor formed when the transistor of a peripheral circuit region is formed. In this case, the transistor formed in the peripheral circuit region and the dummy transistor placed in the support region are formed at the same time. The dummy structure 5, in this example, includes a gate insulating layer 1 and a gate electrode 2, and it may further include spacers 3 on its sidewalls. The dummy structure 5 may further include a tunnel insulating layer, a floating gate, a charge blocking layer, and a control gate or may include a tunnel insulating layer, a charge trap layer, a charge blocking layer, and a control gate depending on the type of device.

If it is difficult to form the incline plane of the projecting part of the support 51 because a height of the dummy structure 5 is low or the top of the dummy structure 5 is flat, an additional structure 4 may be further formed at the top of the dummy structure 5. For example, the additional structure 4 having a section of a triangle or trapezoid may be formed at the top of the dummy transistor so that the projecting part has a sufficient incline plane. The additional structure 4 may be formed of an insulating layer.

Figure 6:
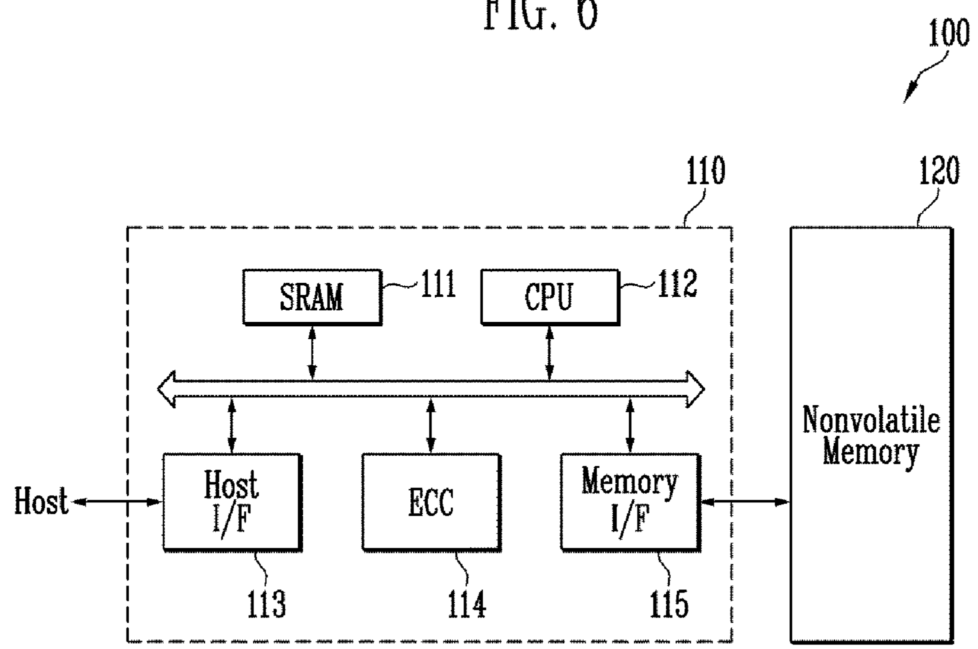
FIG. 6 shows the construction of a memory system according to an example embodiment of this disclosure.

FIG. 6 shows a construction of a memory system according to an example embodiment of this disclosure.

As shown in FIG. 6, the memory system 100 according an example embodiment of this disclosure includes a nonvolatile memory device 120 and a memory controller 110.

The nonvolatile memory device 120 is formed to have the above-described contact structure. Furthermore, the nonvolatile memory device 120 may be a multi-chip package including a plurality of flash memory chips.

The memory controller 110 is configured to control the nonvolatile memory device 120, and it may include SRAM 111, a central processing unit (CPU) 112, a host interface (I/F) 113, an error correction code (ECC) block 114, and a memory I/F 115. The SRAM 111 is used as the operating memory of the CPU 112. The CPU 112 performs an overall operation for the exchange of data of the memory controller 110. The host I/F 113 is equipped with a data exchange protocol between the memory system 100 and a host. Furthermore, the ECC block 114 detects errors in data read from the nonvolatile memory device 120 and corrects the detected errors. The memory interface 115 performs as an interface with the nonvolatile memory device 120. The memory controller 110 may further include RCM for code data for an interface with the host.

The memory system 100 configured as above may be a memory card or a Solid State Disk (SSD) in which the nonvolatile memory device 120 and the memory controller 110 are combined. For example, if the memory system 100 is an SSD, the memory controller 110 may communicate with the outside (for example, the host) through one of various interface protocols, such as a USB, MMC, PCI-E, SATA, PATA, SCSI, ESDI, and IDE.

Figure 7:
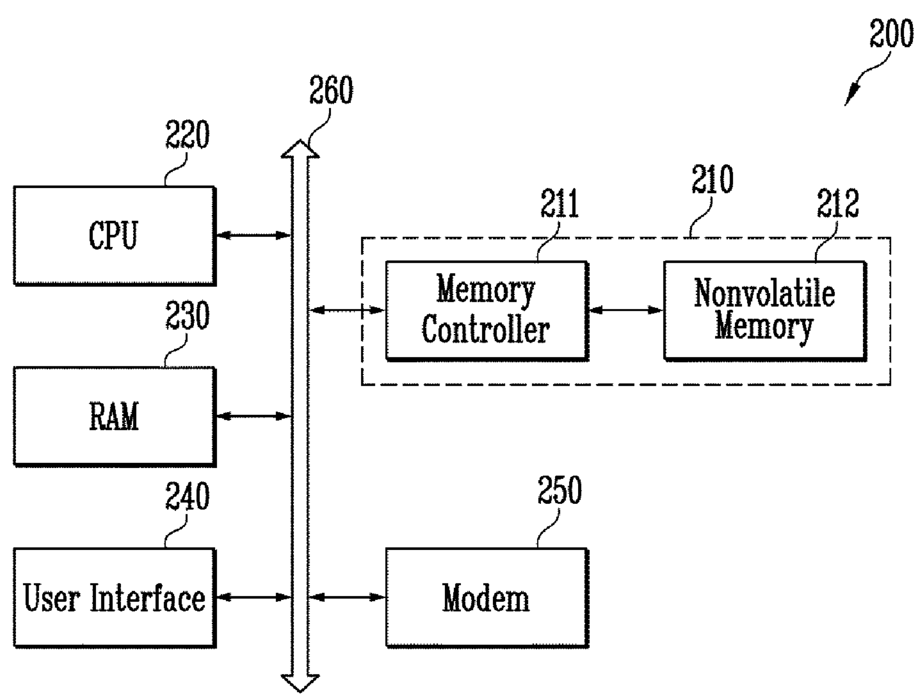
FIG. 7 shows the construction of a computing system according to an example embodiment of this disclosure.

FIG. 7 shows a construction of a computing system according to an example embodiment of this disclosure.

As shown in FIG. 7, the computing system 200 according to an example embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a nonvolatile memory device 212 and a memory controller 211, such as those shown in FIG. 6.

What is claimed is:

1. A three-dimensional (3-D) nonvolatile memory device, comprising:

a support protruded from a surface of a substrate and configured to have an inclined sidewall;

channel structures each configured to comprise interlayer insulating layers and channel layers which are alternately stacked over the substrate including the support, wherein each of the channel structures comprises a cell region where the channel layers are horizontally stacked and a contact region where the channel layers are bent upward along the inclined sidewall of the support and each of the channel layers are exposed;

select lines formed over the contact region of the channel structures; and a pillar type channels coupled to respective channel layers at the contact region and penetrating the select lines, wherein the support has a trapezoidal shape and widths of the channel layers exposed on the top surface of the channel structures are determined by an inclined angle of the support.

2. The 3-D nonvolatile memory device of claim 1, further comprises:

a gate insulating layer interposed between the channel layers and the select lines.

3. The 3-D nonvolatile memory device of claim 2, further comprising bit lines formed over the select lines, coupled to the pillar type channels, and extended in a direction identical with the channel structures.

4. The 3-D nonvolatile memory device of claim 1, wherein the select lines are arranged at a substantially same height.

5. The 3-D nonvolatile memory device of claim 1, wherein the channel structure comprises a top surface in which the contact region and the cell region have a substantially same height without a step.

6. The 3-D nonvolatile memory device of claim 1, wherein the support is formed by etching the substrate.

7. The 3-D nonvolatile memory device of claim 1, wherein the support is formed by etching an insulating layer on the substrate.

8. A three-dimensional (3-D) nonvolatile memory device, comprising:

a support protruded from a surface of a substrate and configured to have an inclined sidewall; and channel structures each configured to comprise interlayer insulating layers and channel layers which are alternately stacked over the substrate including the support, wherein each of the channel structures comprises a cell region where the channel layers are horizontally stacked and a contact region where the channel layers are bent upward along the inclined sidewall of the support and each of the channel layers are exposed, wherein the support includes a dummy structure formed on the substrate and an insulating layer formed on an entire surface of the substrate comprising the dummy structure.

9. The 3-D nonvolatile memory device of claim 8, wherein the dummy structure is a dummy transistor formed on the substrate.

10. The 3-D nonvolatile memory device of claim 1, wherein a distance between the channel structures sharing the support is determined by a width of the flat top surface of the support.

11. The 3-D nonvolatile memory device of claim 1, wherein an angle of the inclined sidewall is 5 to 85°.

12. The 3-D nonvolatile memory device of claim 1, wherein the select lines are placed at different level, arranged in staggered type, and coupled to the respective channel layers.

13. The 3-D nonvolatile memory device of claim 1, wherein each of the select lines is coupled to at least two adjacent channel layers, and select lines adjacent in a stack direction, from among the select lines, are coupled in common to some of the channel layers.

* * * * *